(12) United States Patent
Jacobs et al.

(10) Patent No.: US 7,417,711 B2
(45) Date of Patent: *Aug. 26, 2008

(54) LITHOGRAPHIC APPARATUS AND DEVICE MANUFACTURING METHOD

(75) Inventors: Hernes Jacobs, Eindhoven (NL); Henrikus Herman Marie Cox, Eindhoven (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/593,022

(22) Filed: Nov. 6, 2006

(65) Prior Publication Data
US 2007/0052944 A1   Mar. 8, 2007

Related U.S. Application Data

(62) Division of application No. 10/670,791, filed on Sep. 26, 2003, now Pat. No. 7,239,369.

(30) Foreign Application Priority Data
Sep. 30, 2002   (EP)   .................................. 02256793

(51) Int. Cl.
 G03B 27/42   (2006.01)
 G03B 27/58   (2006.01)
 G03C 5/00    (2006.01)
(52) U.S. Cl. ............................ 355/53; 355/75; 430/311
(58) Field of Classification Search .................. 355/53, 355/72, 75, 77; 430/311, 394, 396; 318/611, 318/623
See application file for complete search history.

(56) References Cited

U.S. PATENT DOCUMENTS

| 5,229,872 | A  | 7/1993  | Mumola |
| 5,296,891 | A  | 3/1994  | Vogt et al. |
| 5,523,193 | A  | 6/1996  | Nelson |
| 5,969,441 | A  | 10/1999 | Loopstra et al. |
| 6,046,792 | A  | 4/2000  | Van Der Werf et al. |
| 6,449,030 | B1 | 9/2002  | Kwan |
| 6,499,936 | B2 | 12/2002 | Ishigame |
| 2001/0006762 | A1 | 7/2001 | Kwan et al. |
| 2002/0012108 | A1 | 1/2002 | Hara et al. |
| 2003/0202865 | A1 | 10/2003 | Ponnekanti et al. |

FOREIGN PATENT DOCUMENTS

EP   1 111 469 A2   6/2001

(Continued)

OTHER PUBLICATIONS

English Translation of JP 2002-022868 (dated Jan. 23, 2002).*

(Continued)

*Primary Examiner*—Alan A Mathews
(74) *Attorney, Agent, or Firm*—Pillsbury Winthrop Shaw Pittman LLP

(57) ABSTRACT

A lithographic projection apparatus in which a balance mass is supported by a base frame using at least one supporting member which is coupled to both the base frame and balance mass. Free horizontal movement is provided by providing the supporting member with at least two pivot points.

11 Claims, 9 Drawing Sheets

FOREIGN PATENT DOCUMENTS

| | | |
|---|---|---|
| EP | 1 111 470 A2 | 6/2001 |
| JP | 63-153819 | 6/1988 |
| JP | 64-40089 | 3/1989 |
| JP | 5-335199 | 12/1993 |
| JP | 2002-15985 | 1/2002 |
| JP | 2002-22868 | 1/2002 |
| JP | 2002-25903 | 1/2002 |
| WO | 98/33096 | 7/1998 |
| WO | 98/38597 | 9/1998 |
| WO | 98/40791 | 9/1998 |

OTHER PUBLICATIONS

English Translation of JP 5335199 (dated Dec. 17, 1993).*
European Search Report dated Jul. 10, 2003.
European Search Report for Application No. EP 03 25 6067 completed Feb. 4, 2004.
Japanese Office Action for Japanese Patent Application No. 2003-373440.

* cited by examiner

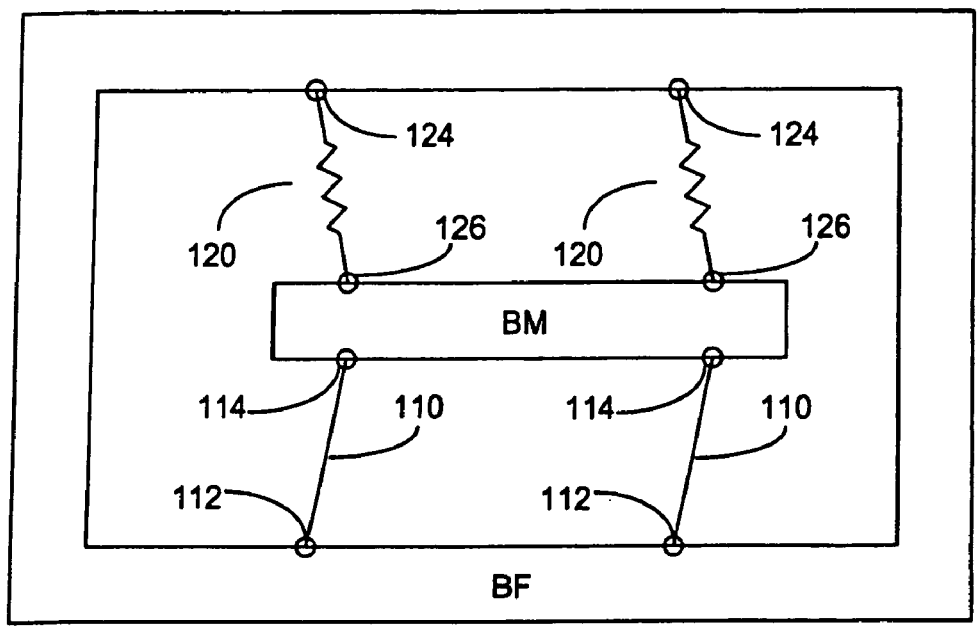
Fig. 3
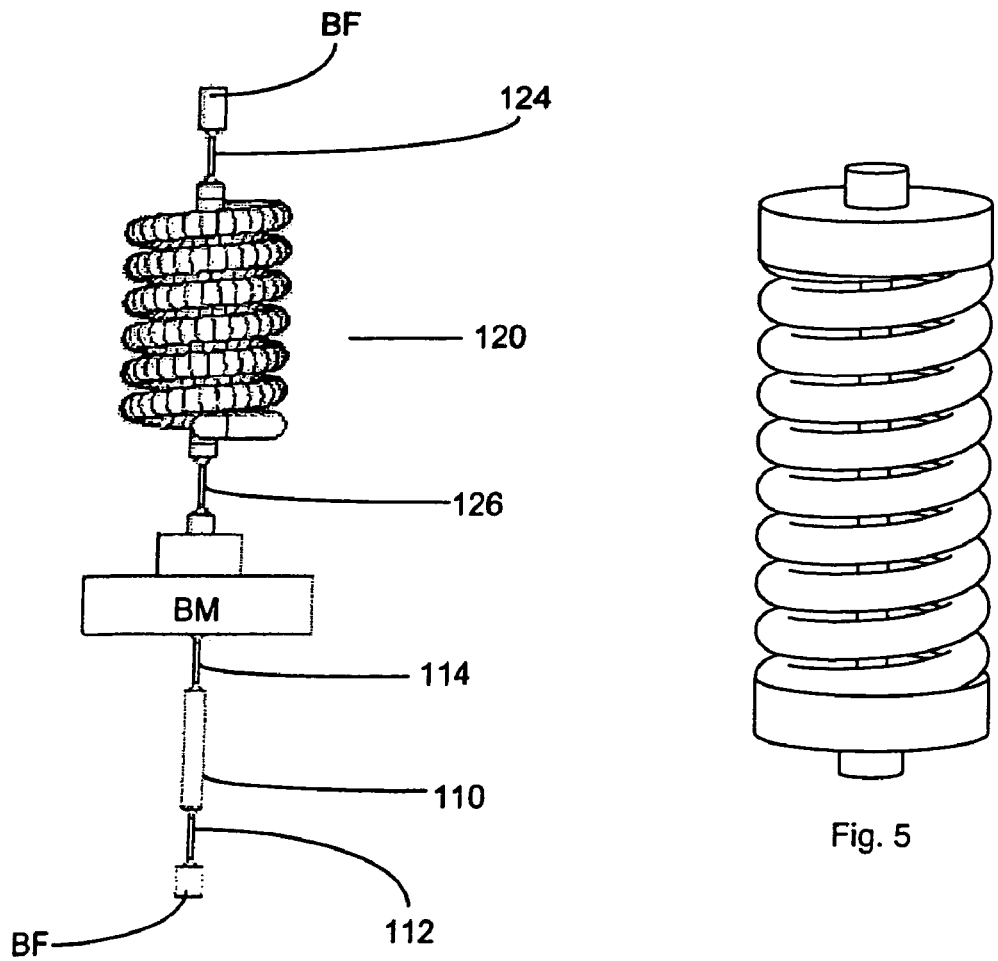
Fig. 4
Fig. 5

LITHOGRAPHIC APPARATUS AND DEVICE MANUFACTURING METHOD

RELATED APPLICATIONS

This application is a divisional application of U.S. application Ser. No. 10/670,791, filed Sep. 26, 2003, which claims the benefit of European Patent Application EP 02256793.7, filed Sep. 30, 2002, each of which are incorporated herein by reference in their entirety.

BACKGROUND

1. Field of the Invention

This invention relates to lithographic apparatus and methods.

2. Background Information

The term "patterning device" as here employed should be broadly interpreted as referring to structure that may be used to endow an incoming radiation beam with a patterned cross-section, corresponding to a pattern that is to be created in a target portion of the substrate. The terms "light valve" and "spatial light modulator" may also be used in this context. Generally, such a pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam may cause selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which may be individually tilted about an axis by applying a suitable localized electric field, or by employing piezoelectric actuation means. The mirrors may be matrix-addressable, such that addressed mirrors will reflect an incoming radiation beam in a different direction with respect to unaddressed mirrors; in this manner, the reflected beam is patterned according to the addressing pattern of the matrix-addressable mirrors. The required matrix addressing can be performed using suitable electronic circuitry. In both of the situations described hereabove, the patterning device can comprise one or more programmable mirror arrays. More information on mirror arrays as here referred to can be gleaned, for example, from U.S. Pat. Nos. 5,296,891 and 5,523,193, which are incorporated herein by reference, and PCT patent applications WO 98/38597 and WO 98/33096, which are incorporated herein by reference. In the case of a programmable mirror array, the support structure for the array may be embodied, for example, as a frame or table which is fixed or movable as required.

A programmable LCD array. An example of such a construction is given in U.S. Pat. No. 5,229,872, which is incorporated herein by reference. As above, the support structure in this case may be embodied, for example, as a frame or table which is fixed or movable as required.

For purposes of simplicity, the rest of this text may, at certain locations, specifically direct itself to examples involving a mask (or "reticle") and mask table; however, the general principles discussed in such instances should be seen in the broad context of the patterning device as hereabove set forth.

Lithographic projection apparatus may be used, for example, in the manufacture of devices such as integrated circuits (ICs). In such a case, the patterning device may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. A projection beam in a scanning type of apparatus may have the form of a slit (e.g. rectangular or arcuate) with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will be repeated for each new layer.

Eventually, an array of devices will be present on the substrate (wafer). The devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and PCT Application WO 98/40791, which documents are incorporated herein by reference.

In a lithographic projection apparatus, if a substrate table is moved by an actuator attached to a base frame, a reaction force is transferred to the base frame. In some apparatus, a substrate table may weigh as much as 40 to 70 kg or more, and the acceleration of the substrate table may be on the order of 5 to 60 m/s$^2$. Therefore, the reaction force may be high enough to cause deleterious vibrations or movement of the base frame.

The effect of such a reaction force can be reduced by the use of a freely mounted balance mass. For example, a positioning actuator may be used between the substrate table and the balance mass such that the substrate table is moved in one direction whilst the balance mass is moved by the reaction force in the opposite direction. In such case, the balance mass may be moved by an amount equal to the distance moved by the substrate table times the mass ratio of the substrate table to the balance mass. In this way, no substantial reaction forces are transmitted to the base frame, and the centre of gravity of the balance mass and the substrate table relative to the base frame stays relatively constant.

The balance mass and substrate table are mounted, as near as possible, in a frictionless manner, e.g. using air bearings, such that no further parasitic forces are transmitted to the base frame or other parts of the lithographic projection apparatus as a result of movement of the substrate table.

To meet the ever-present demand for imaging features of reduced size, it is desirable to reduce the wavelength of radiation used for the projection beam. Thus, the need for improved resolution encourages the development of lithographic projection apparatus making use of extreme ultraviolet radiation (EUV) (e.g. with a wavelength in the range of 5-20 nm). Currently, an EUV lithographic projection apparatus must use mirrors in the projection system because no material suitable for forming refractive optical elements for EUV is yet known.

Additionally, the beam must be kept in vacuum to avoid contamination and attenuation of the beam. Unfortunately, the requirement for the projection beam to be kept in a vacuum means that the use of air bearings for the balance mass is no longer practical. Although a design has been proposed in which the air bearings are covered by a metal bellows, this design is complicated and heavy.

SUMMARY

A lithographic apparatus according to one embodiment of the invention includes an illuminator and a substrate table disposed in a path of a radiation beam from the illuminator. The apparatus also includes a patterning device support disposed to hold a patterning device in the path of the radiation beam between the illuminator and substrate table, and a projection system that is disposed in a path of the radiation beam between the patterning device support and the substrate table.

The apparatus further includes a base frame and a balance mass supported by and moveable relative to said base frame. The balance mass is coupled to at least one of the substrate table and the patterning device support. At least one supporting member is attached to the balance mass and to the base frame. This at least one supporting member has a stiff portion and at least two pivot points.

A lithographic apparatus according to another embodiment of the invention also includes at least one supporting member attached to the balance mass and to the base frame. In this case, across an entire cross-section of the at least one supporting portion, the at least one supporting portion is disposed to be under tension. This tension is in a direction parallel to a principal axis of the at least one supporting portion, while the cross-section is taken in a plane perpendicular to the principal axis.

Methods of manufacturing devices are also disclosed herein. Although specific reference may be made in this text to the use of the apparatus according to the invention in the manufacture of ICs, it should be explicitly understood that such an apparatus may have many other possible applications. For example, it may be employed in the manufacture of devices such as integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 3 depicts a principle of operation of a balance mass support according to a first embodiment of the present invention;

FIG. 4 depicts a supporting element and elastic means according to the first embodiment of the present invention;

FIG. 5 depicts a combined supporting element and elastic means according to the first embodiment of the present invention;

In the Figures, corresponding reference symbols indicate corresponding parts.

DETAILED DESCRIPTION

Embodiments of the present invention include means for supporting a balance mass which is vacuum-compatible. Such and other embodiments may provide a support which allows free movement of the balance mass without any significant parasitic stiffness in the horizontal direction.

Figure 1:
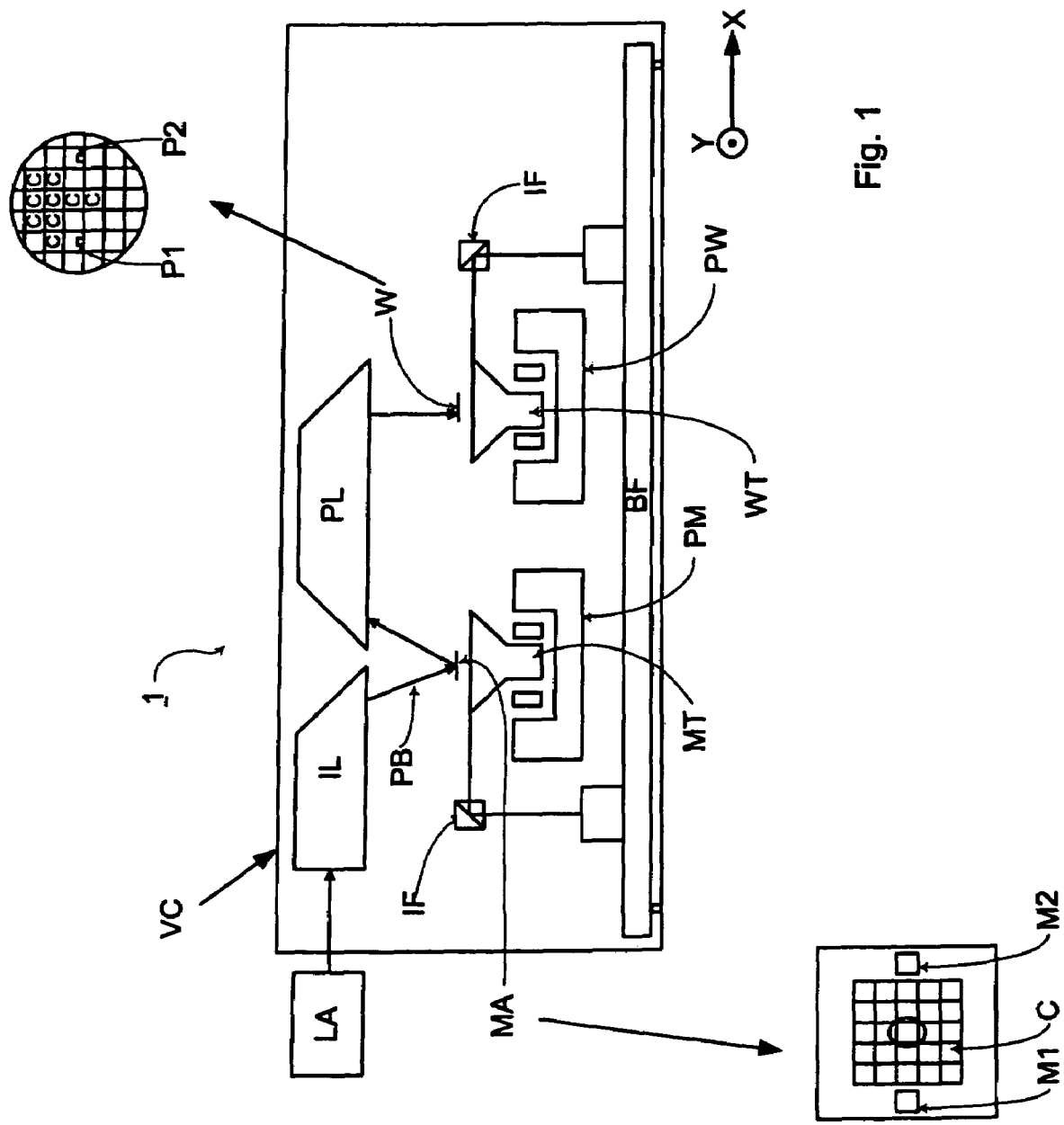
FIG. 1 depicts a lithographic projection apparatus according to an embodiment of the invention.

FIG. 1 schematically depicts a lithographic projection apparatus according to a particular embodiment of the invention. The apparatus comprises:

An illuminator configured to supply at least one projection beam PB of radiation. In this particular example, the illuminator Ex, IL for supplying a projection beam PB of radiation (e.g. EUV radiation) also comprises a radiation source LA;

A support structure configured to support a patterning device capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and A projection system ("lens") configured to project the patterned beam. In this example, projection system PL (e.g. a catadioptric lens system) is configured to image an irradiated portion of the mask MA onto a target portion C (e.g. comprising one or more dies) of the substrate W.

As here depicted, the apparatus is of a reflective type (e.g. has a reflective mask). However, in general, it may also be of a transmissive type, for example (e.g. having a transmissive mask). Alternatively, the apparatus may employ another type of patterning device, such as a programmable mirror array of a type as referenced above.

The source LA (e.g. a laser-produced or discharge plasma source, or an undulator provided around the path of an electron beam in a storage ring or synchrotron) produces a beam of radiation. The beam is fed into an illumination system (illuminator) IL, either directly or after having traversed conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring means IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB.

2. In scan mode, essentially the same scenario applies, except that a given target portion C is not exposed in a single "flash." Instead, the mask table MT is movable in a given direction (the so-called "scan direction," e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
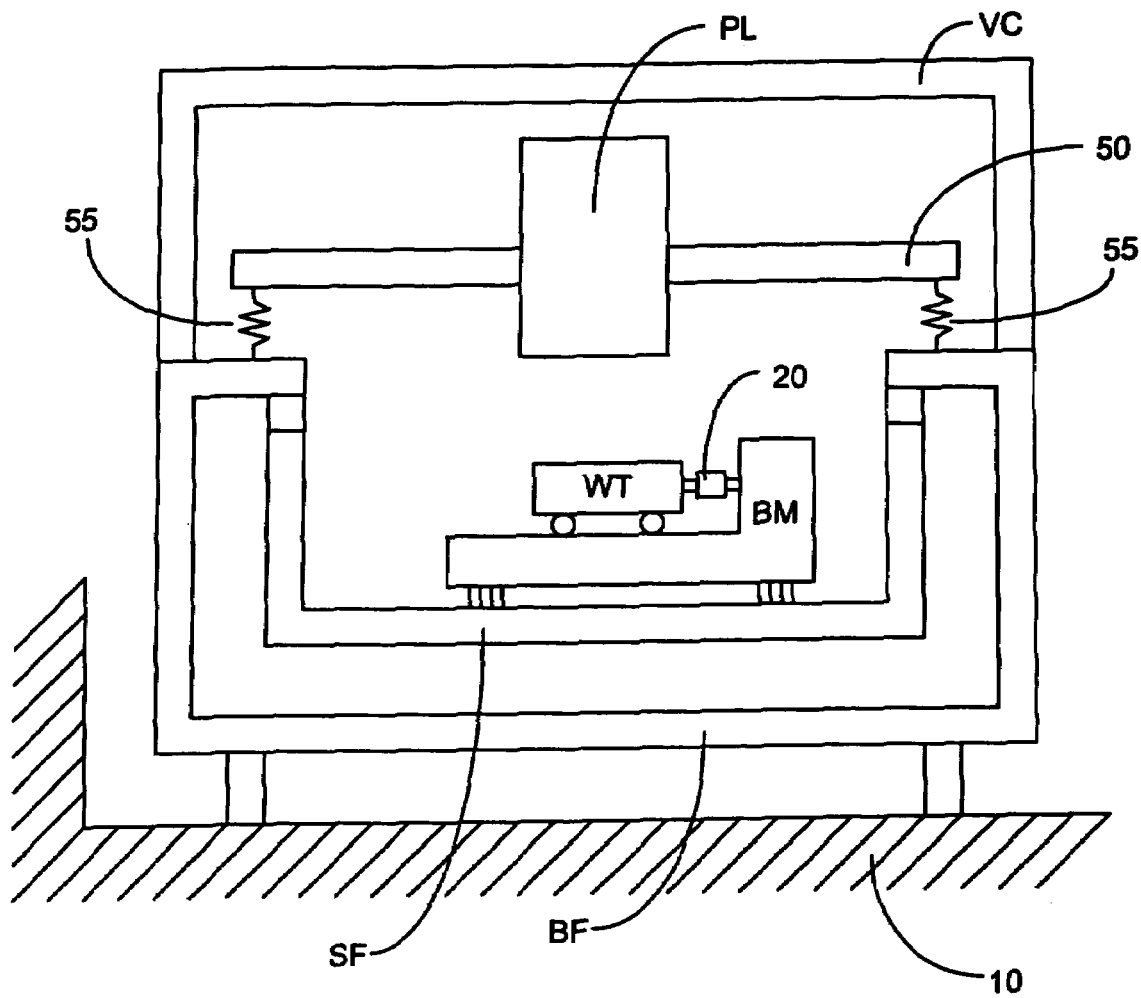
FIG. 2 depicts a principle of operation of a balance mass in an apparatus according to an embodiment of the invention.

FIG. 1 shows a typical EUV apparatus including a base frame BF on which various components of the lithographic projection apparatus are supported. FIG. 2 shows a base frame BF that is stiffly connected to the ground 10. In other implementations, base frame BF may be connected to the ground 10 in an isolating manner.

As shown in FIG. 2, some of the components of the EUV apparatus, such as a substrate table vacuum chamber VC, are connected in a stiff manner to the base frame BF. Other components may be connected to the base frame BF in a nonstiff manner. For example, FIG. 2 shows that projection system PL is isolated from vibrations of the base frame BF by being mounted on a metrology frame 50 which is compliantly connected to the base frame BF with springs 55 of an active vibration isolation system (AVIS).

Any disturbance forces on the base frame BF will be partially transmitted to the metrology frame 50 via the mechanical springs 55 of the active vibration isolation system (AVIS). The resulting motion of metrology frame 50 may disturb sensors of the wafer stage WT and/or the position sensors of any optical element in the projection system PL. Such a disturbance may result in large positioning errors and thus in overlay and CD (critical dimension) errors.

In order to minimize the disturbance forces on the base frame BF, the substrate table WT may be positioned on a substrate table support frame SF (which is stiffly connected to the base frame BF) in accordance with Newton's law of conservation of momentum. As shown in FIG. 2, for example, a positioning actuator 20 may be provided between the substrate table WT and a balance mass BM. Both the substrate table WT and the balance mass BM are mounted such that translation or movement in the horizontal plane parallel to the surface of the substrate table support frame SF is substantially free.

On actuation of the positioning actuator 20 to generate a reaction force, the substrate table WT and balance mass BM translate in opposite directions by different amounts dependent upon the mass ratio balance mass to the substrate table. In this way, the substrate table WT may be positioned relative to the projection system PL using calculations based on Newton's law.

A flywheel may be arranged on the balance mass which is rotatable in a plane perpendicular to the plane of translational movement of the balance mass. In this way, if the substrate table WT is to be rotated, a reaction force may be applied to the balance mass BM by changing the plane of rotation of the flywheel.

FIG. 3 illustrates schematically how the balance mass BM is mounted to the base frame BF in the first embodiment of the present invention. In the description of this and further embodiments, it is understood that for purposes of mounting balance mass BM to base frame BF, base frame BF may be considered to include structures (such as substrate table support frame SF) that are stiffly connected to the base frame BF.

The balance mass is supported on the base frame by at least one supporting element 110, that is, the supporting element takes the weight of the balance mass BM and transfers it directly to the base frame. The illustrated embodiment shows two such supporting elements, though in practice it is likely that more than two would be required. Preferably there are at least three supporting elements 110, of which one or more in use may be below or underneath the balance mass. The supporting elements 110 are stiff and preferably pre-tensioned to keep them from deforming.

The supporting elements 110 are pivotally attached to the base frame BF and the balance mass BM at each end by hinges 112, 114. Preferably the hinges 112, 114 are elastic hinges that are formed of elastic material extending between the ends of the stiff bar and the balance mass and base frame respectively, so that on deflection of the hinge from the dead-ahead position a small force is generated towards the dead-ahead position. Such an arrangement is illustrated in FIG. 4. Alternatively, in the first embodiment, the hinges 112, 114 may have zero stiffness (i.e. be non-elastic). For example, one or more of hinges 112, 114 may include ball bearings.

In some arrangements, supporting elements 110 may be mounted such that when the hinges 112, 114 of each of the supporting elements align vertically, the balance mass is positioned such that there will be no horizontal components of the force generated by gravity on the balance mass BM. However, when the balance mass is positioned in such an arrangement such that the hinges 112, 114 of the support elements 110 are not vertically aligned, a horizontal force will be generated by the action of gravity on the balance mass BM. This force generation is termed "negative stiffness."

This negative stiffness can be compensated by applying a compensating force to the balance mass BM using, e.g., an elastic structure. In an apparatus according to the first embodiment, the elasticity of the hinges 112, 114 is not large enough to apply this force, and so at least one spring 120 is connected between the base frame BF and balance mass BM. By sizing the elastic structure correctly (e.g. with respect to the hinges 112, 114), the horizontal force due to the action of gravity on the balance mass BM can be precisely compensated by the force generated by parasitic horizontal stiffness of the elastic structure. As shown in FIG. 4, the elastic element may include a pivot point (e.g. hinges 124, 126) at its connections to the base frame and balance mass, respectively. As illustrated in FIG. 4, such hinges may be of the elastic type as used in conjunction with the supporting element 110.

In this way, it is possible to provide a support structure for the balance mass with a long stroke and low horizontal stiffness (i.e. low horizontal eigenfrequency) and high vertical stiffness.

As will be appreciated, a parasitic horizontal stiffness may also be provided for by horizontal springs connected between the balance mass BM and base frame BF.

FIG. 5 shows an alternative arrangement in which the elastic structure 120 is provided in conjunction with the supporting element 110. This variation has the advantage of being more compact than having separate supporting elements and elastic elements. The spring 120, which is about 300 mm long, is pretensioned and connected between the balance mass BM and base frame BF. With this arrangement, there is no need to have elastic components positioned above the balance mass BM as illustrated in FIG. 3.

The spring 120 may be made of any strong and elastic material. Presently preferred materials are spring steel and titanium.

In a further arrangement, the embodiment as illustrated in. FIG. 3 may be configured the other way around: i.e. with elastic structure (e.g. springs 120) being in compression (e.g. below or underneath the balance mass BM) and with the supporting elements 110 being flexible ties such as cables (e.g. over or above balance mass BM).

The second embodiment of the invention will now be described with reference to FIGS. 6 to 9. The second embodiment of the present invention is the same as that of the first embodiment save as described below.

Figure 6:
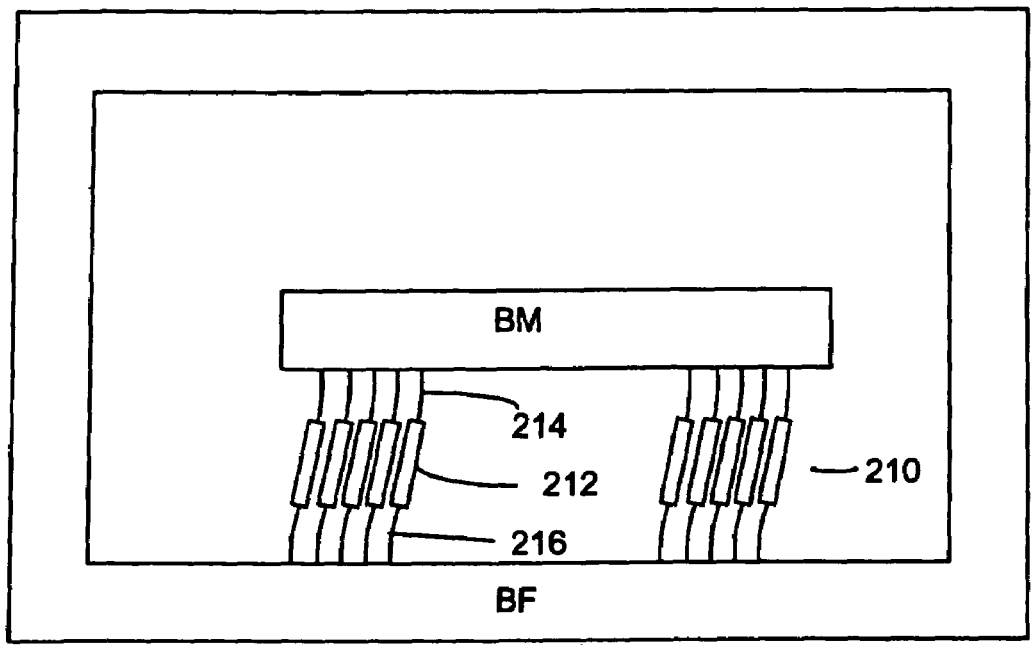
FIG. 6 depicts a principle of operation of a second embodiment of the present invention.

In FIG. 6 the balance mass BM is supported on the base frame BF by a plurality of supporting elements 210 which include elastic rods placed underneath the balance mass BM and mechanically attached to the balance mass BM and the base frame BF. The cross-section of the rod in a plane perpendicular to the longitudinal direction of the rod is preferably square, because the stress at maximum deflection is lowest for such a thin cross section. However, circular or other cross-sections are also possible.

As is illustrated in FIG. 6, the rods are designed to pivot above and below a central portion 212, which may or may not be more stiff than the rest of the rod. The same principle as in the first embodiment may be applied: namely that the horizontal force generated by the balance mass due to gravity is compensated for by the elastic means (in this case, the supporting elements 210 themselves). The amount of force due to gravity is a function of the difference in the lengths between the balance mass center of gravity and the pivot points. The larger the distance, the smaller the stiffness and thus the swing or pendulum eigenfrequency.

The theory behind this concept is to use this negative "swing" stiffness to compensate for the (undesired) positive horizontal stiffness of the flexible supporting elements 210. The balance mass BM is free to move in the horizontal direction, with zero parasitic stiffness, if the negative swing stiffness exactly compensates the horizontal parasitic stiffness of the flexible mounts. Such a condition may be achieved by ensuring that the supporting element 210 has pivot points 214, 216 below the center of gravity of the balance mass BM on either side of the central portion 212 of the supporting element 210.

The negative stiffness (i.e. the horizontal force due to gravity on the balance mass BM) can be easily calculated using basic principles, as can the stiffness of the supporting elements 210. It is then a matter of designing the relevant dimensions and stiffnesses such that those two forces are equal. If the balance mass BM weighs about 2000 kg, for example, it has been found that two sets of rods (with 25 rods in each set, each rod having a diameter of 3.7 mm, a length of 300 mm between pivot points, and an overall length of 350 mm) works well. In this case, a maximum vertical displacement (which is undesirable) of only 240 µm is present at a maximum horizontal displacement of $12 \times 10^{-3}$ m for a tolerable mechanical stiffness of 6 to 10 N/mm in the horizontal direction and $7 \times 10^7$ N/m in the vertical direction.

Figure 7:
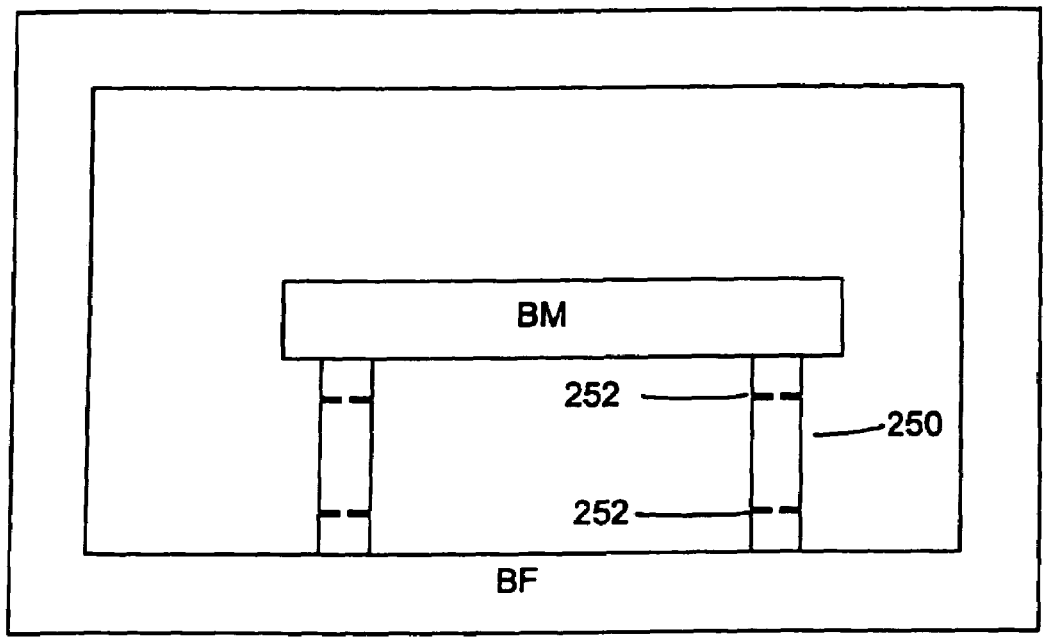
FIG. 7 depicts another principle of operation of the second embodiment of the present invention.

FIG. 7 illustrates an alternative arrangement to the arrangement shown in FIG. 6. In this arrangement, the supporting elements are cardanic beams 250 which are stiff except for two pivot points 252 formed by hinges, one positioned closer to the balance mass and one closer to the base frame. The two hinges 252 are elastic in nature such that they provide the force which compensates for the force on the balance mass due to gravity.

Figure 8:
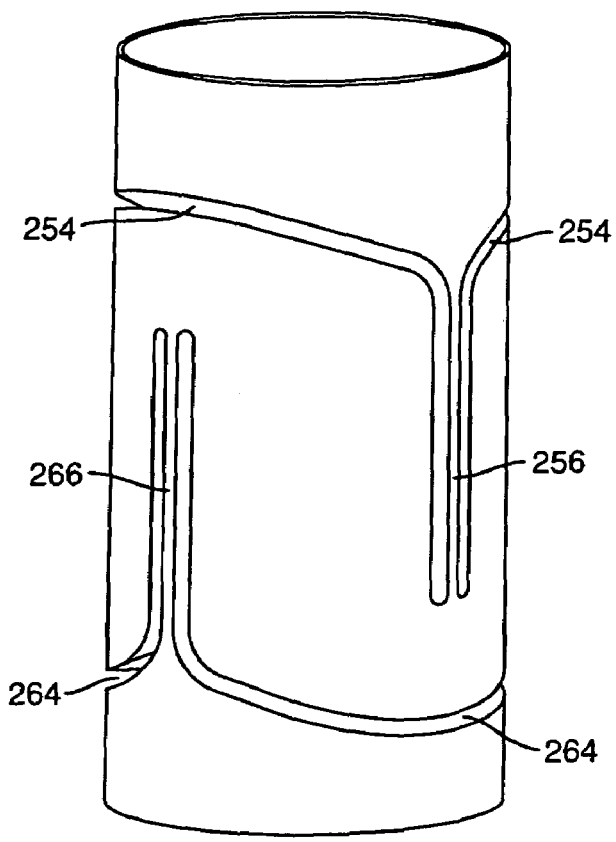
FIG. 8 depicts an elastic hinge according to the second embodiment of the present invention.
Figure 9:
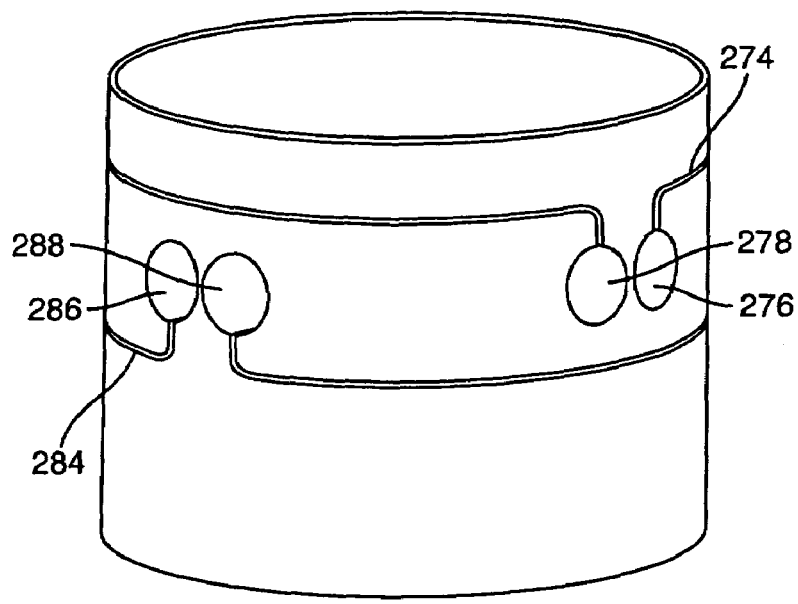
FIG. 9 depicts an alternative design of an elastic hinge according to the second embodiment of the present invention.

FIGS. 8 and 9 illustrate two embodiments of hinge 252 in which it can be seen that they are preferably manufactured of solid material which should be strong and elastic. Example materials are spring steel and titanium. In each of the hinges illustrated, the rod is formed (e.g. the material is machined away from the solid rod) such that only small slices of material are left which can be deformed by typical forces involved in the present invention. Although rods having circular cross-sections are shown, square and other cross-sections are also possible.

In the hinge illustrated in FIG. 8, first cuts 254 are made in the solid rod to leave only a slice 256 of material in the longitudinal direction of the rod supporting the load. Second cuts 264 leave only a second slice 266. The two slices 256, 266 in the longitudinal direction are positioned orthogonally such that cardanic movement in two dimensions of the hinge is possible by compliant binding of the slices 256, 266. In another arrangement, one hinge may include only first cuts 254 while the other hinge includes only second cuts 264.

In the embodiment illustrated in FIG. 9, two sets of two holes 276, 286 are formed in (e.g. drilled through) the rod at orthogonal angles, each set of holes being perpendicular to the longitudinal direction of the rod. In combination with these holes, cuts 274, 284 leave two slices 276, 286 of material supporting the load. Thus movement in two dimensions of the top part of the rod (i.e. above the hinge) relative to the bottom part (i.e. below the hinge) is possible. In another arrangement, one hinge may include only cuts 274 while the other hinge includes only cuts 284.

For the cardanic system of FIG. 7, calculations have shown that one such system of three cardanic beams, each having a length of 500 mm between pivot points, a total length of 583 mm, and a square cross section of 100 mm by 100 mm, gives satisfactory results for a maximum horizontal displacement of $12 \times 10^{-3}$ m. In this case, the maximum vertical displacement is only 144 µm.

The third embodiment will be described with reference to a two-dimensional system (i.e. one which allows movement with one degree of freedom) in FIG. 10 and a three-dimensional system (i.e. one which allows movement with two degrees of freedom) in FIG. 11. The third embodiment is the same as the first embodiment save as described below.

As can be seen from FIG. 10, the balance mass in the third embodiment is supported by supporting elements 310. In the illustrated embodiment, the supporting elements 310 are shown as being positioned underneath the balance mass BM. However, in practice the supporting elements 310 may be positioned either above or below the balance mass BM. Preferably there are at least three supporting elements 310.

Figure 10A:
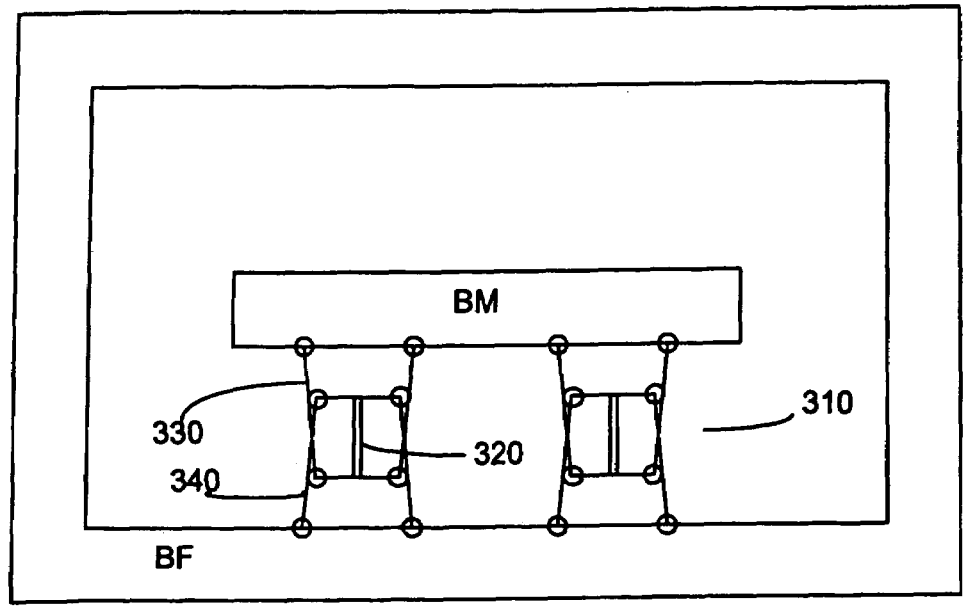
FIGS. 10a and b depicts a principle of operation in two dimensions of a third embodiment of the present invention.
Figure 10B:
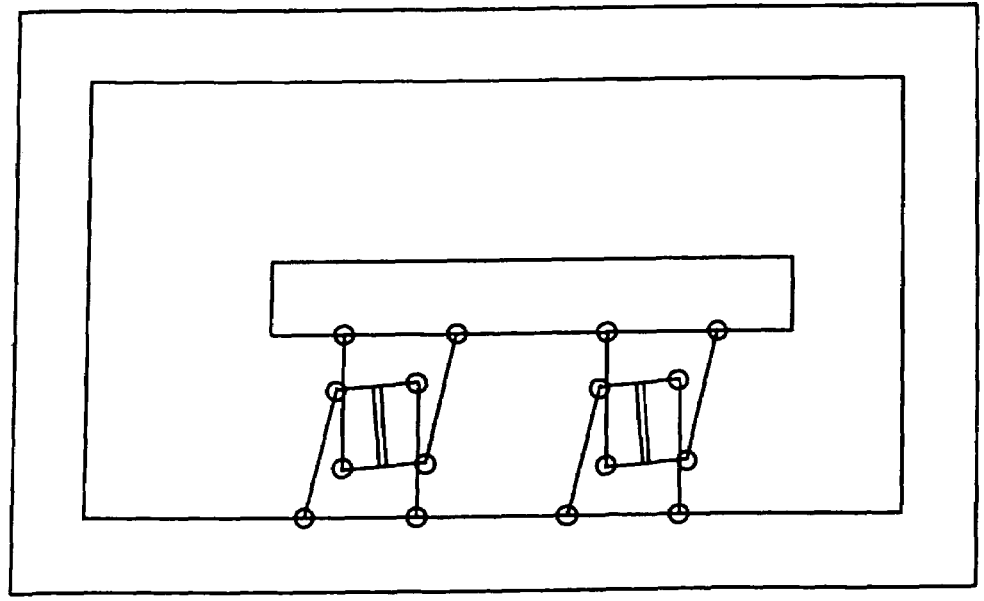

In contrast to the first and second embodiments, in the third embodiment the vertical height of the balance mass BM relative to the base frame BF does not change significantly on horizontal movement of the balance mass. This effect is achieved by use of the supporting element 310. FIGS. 10a and 10b shows how this effect is possible in two dimensions, and FIGS. 11 and 12 show how the system can be adapted to three dimensions.

Referring to FIGS. 10a and b, each supporting element 310 is comprised of a middle section 320 which provides for indirect connection between the balance mass BM and the base frame BF (e.g. about 150 mm apart). Balance mass connecting members 330 are pivotally connected to the balance mass and pivotally connected to the middle section 320. Similarly, base frame connecting members 340 are pivotally connected between the base frame BF and the middle section 320. The pivotal connections are provided e.g. by hinges.

In the illustrated embodiment, the middle section 320 has an I shape. However, any shape may be used, so long as the balance mass connecting members 330 may be connected in a single plane to the middle section 320 and the base frame connecting members 340 may also be connected in a single plane separate from the plane in which the balance mass connecting members are connected to the middle section 320.

Preferably the lengths of all of the base frame connecting members 340 are the same, and the lengths of all of the balance mass connecting members 330 are the same. In this way, it is possible for the balance mass BM to be moved in the horizontal direction relative to the base frame BF without the balance mass BM being vertically displaced. As can be seen from FIG. 10b, the vertical position of balance mass BM is maintained by rotation of the middle section 320 and by changing of the angle of the base frame and balance mass connecting members relative to the balance mass, base frame and middle section. Thus all of the components of the supporting elements 310 are stiff (except the pivots or hinges). The pivot points (e.g. hinges) between the connecting members 330, 340, the balance mass BM, the base frame BF and the middle section 320 are free-running, so that the balance mass BM may be moved in the horizontal direction with a stroke of up to 30 mm with little horizontal stiffness but high vertical stiffness.

Figure 11:
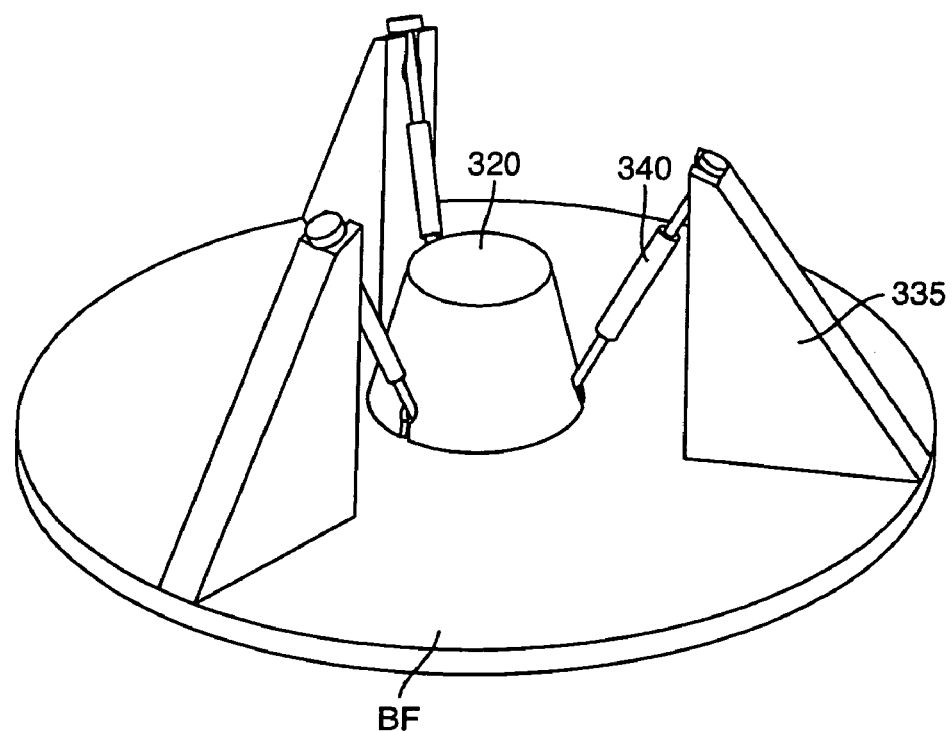
FIG. 11 depicts in detail a bottom half of a practical three-dimensional arrangement according to a fourth embodiment of the present invention.
Figure 12:
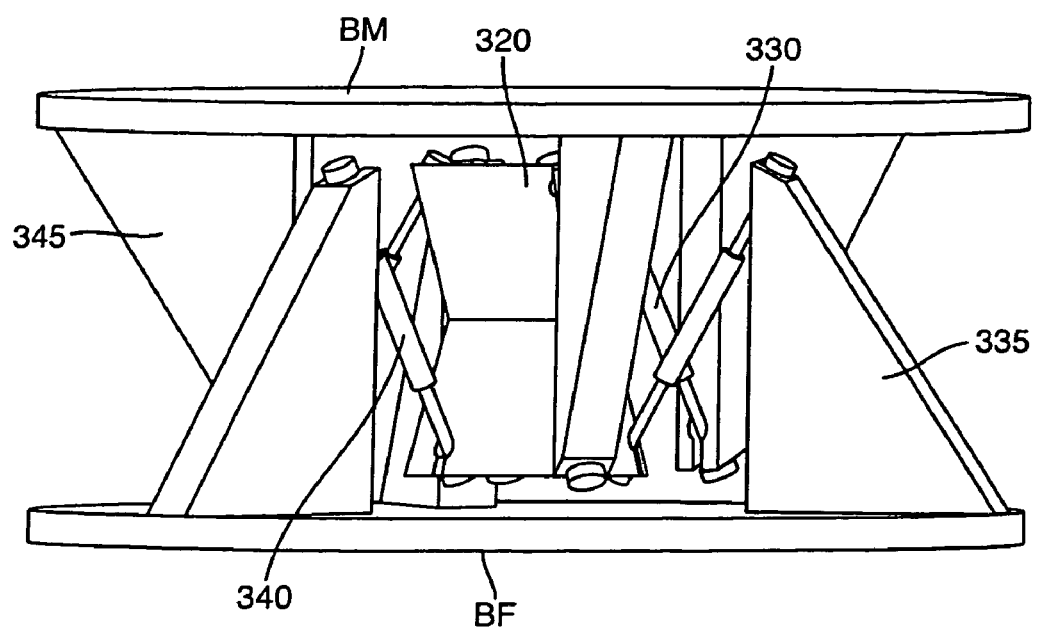
FIG. 12 depicts in detail a complete practical three-dimensional arrangement according to the fourth embodiment of the present invention.

In FIGS. 11 and 12, a fourth embodiment is illustrated which uses the same two-dimensional principles as illustrated in FIGS. 10a and 10b but in three dimensions. In this embodiment, the bottom half (FIG. 11) comprises base frame connecting members 340 connected to a middle section 320. This arrangement is achieved by providing supports 335 which extend from the plane of the base frame BF towards the balance mass BM and to which the base frame connecting members 340 are connected. The supports 335 ensure that the connecting members 340 are loaded with tension only. Therefore, no buckling effects are to be expected. The supports 335 may be stiffly connected to the base frame BF. For the bottom half as illustrated in FIG. 11, the connecting members 340 may be flexible ties such as cables.

A similar arrangement with balance mass supports 345 is used for the upper half as illustrated in FIG. 12. The pivotal attachments between the base frame connecting members 340 and the base frame supports 335 are closer to the balance mass than the pivotal connection between the balance mass connecting members 330 and the balance mass supports 345. Thus this aspect of the construction for the three-dimensional embodiment is reversed from that of the two-dimensional embodiment, but the principle of operation is the same. The supports 345 may be stiffly connected to the balance mass BM.

Rotation of the balance mass BM is also provided for in this case, because the middle section 320 is in an upper and a lower part which parts are rotatable relative to each other around an axis perpendicular to the planes of the balance mass BM and base frame BF. If the middle section 320 does not have upper and lower parts which are rotatable relative to one another, rotation of the balance mass BM relative to the base frame BF may result in a small vertical translation.

As shown in both the two- and three-dimensional embodiments, the balance mass and base frame supporting elements pass through some common planes which are parallel to the balance mass BM and the base frame BF planes.

The fifth embodiment will be described with reference to a two-dimensional system (i.e. one which allows movement with one degree of freedom), but such an arrangement can also be applied as a three-dimensional system allowing for three degrees of freedom (x, y, Rz). The fifth embodiment is the same as the first embodiment except as described below.

Figure 13:
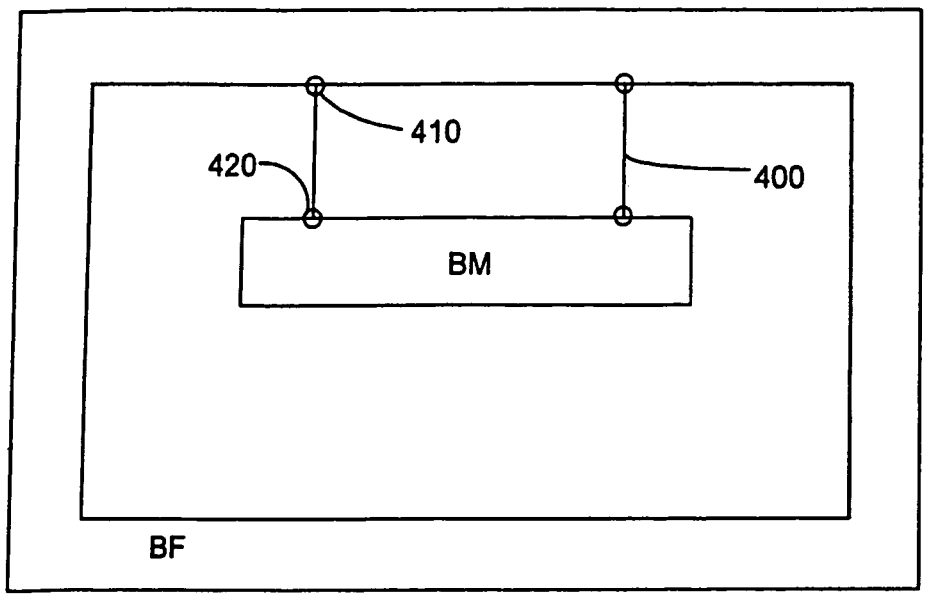
FIG. 13 depicts a principle of operation of a fifth embodiment of the present invention.

As is illustrated in FIG. 13, the balance mass BM is supported on the base frame BF by supporting elements 400 which are in tension (e.g. cables or ties). The supporting elements 400 have two pivot points 410, 420, and the supporting element 400 can bend at those pivot points at least. As illustrated, the pivot points 410, 420 are hinges at the position at which the supporting element 400 is attached to the base frame BF and balance mass BM. However, this is not necessarily the case, especially in the instance where the supporting element 400 is comprised of a flexible element such as a cable. In this case, hinges do not need to be provided, and the two pivot points are formed naturally by the tie as the balance mass moves from side to side.

As the balance mass moves to one or the other side from its equilibrium position, it will experience a centering force on it due to gravity. This centering force is, in some circumstances, desirable because it means that the balance mass will not drift away from its central position.

Figure 14:
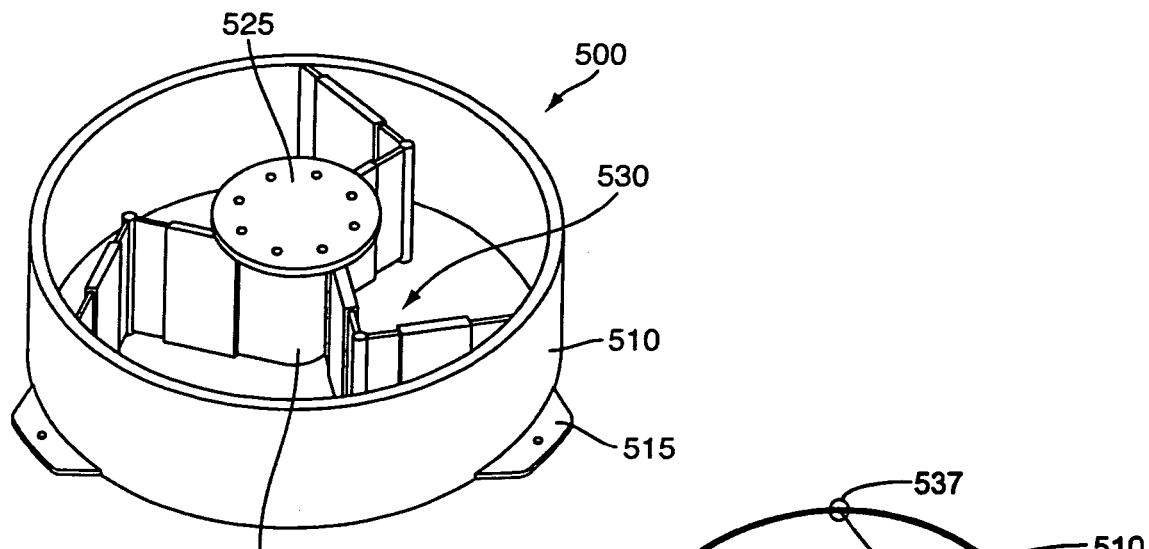
FIG. 14 depicts a practical three-dimensional arrangement according to a sixth embodiment of the present invention.

The sixth embodiment will be described with reference to FIGS. 14 and 15. The sixth embodiment is the same as the first embodiment except as described below.

In the sixth embodiment the balance mass BM is supported by at least one balance mass supporting member 500. Preferably there are at least three balance mass supporting members 500 supporting the balance mass BM on the base frame BF. In the illustrated arrangement, the balance mass supporting member 500 is comprised of an outer structure 510 in the form of a ring. The outer structure 510 is attached to the base frame BF through attachment points 515.

The balance mass BM is attached to a central structure 520 of the balance mass supporting member 500 which is positioned within the outer structure 510. In the illustrated embodiment the central structure 520 has a top plate 525 which is attached to the balance mass BM. The top plate 525 may be flexible for rotations with respect to the outer structure 510 so as to allow the balance mass BM to move relative to the central structure 520. Alternatively, the top plate 525 may be mounted to the central structure via a ball and socket (or shaft and bearing) arrangement which allows the balance mass BM to rotate relative to the central structure 520, thereby making rotations around the Rz axis (the optical axis) possible.

Figure 15:
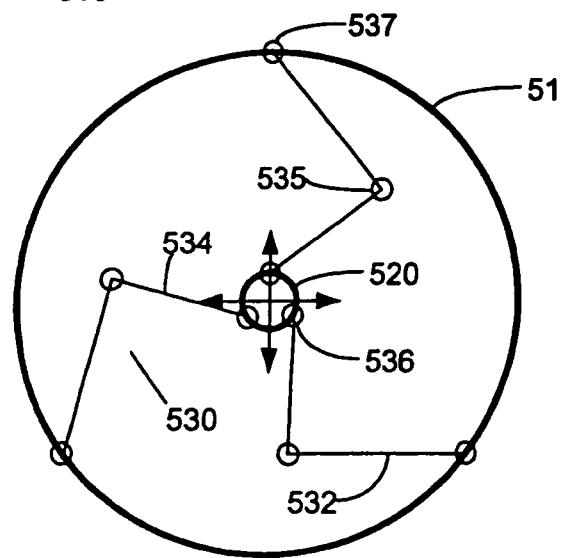
FIG. 15 depicts a principle of operation of the sixth embodiment of the present invention.

As is most clearly seen in FIG. 15, the central structure 520 is attached to the outer structure 510 by supporting elements 530. Preferably there are at least three supporting elements 530 which are strong enough to support the weight of the balance mass BM. The supporting elements 530 are hinged at the positions at which they are attached to the outer structure 510 and the central structure 520 (positions 536, 537) and also at an intermediate point (e.g. close to the center of the supporting element) at position 535. These pivot points 535, 536, 537 allow relative rotation of the parts they connect around an axis which is substantially orthogonal to the plane in which the balance mass moves.

Elements 532 and 534, which are positioned between the pivot points, are engineered so that they do not bend under the loads experienced. For this reason they are preferably flat or substantially elongated in cross-section, with their main plane being orthogonal to the plane in which the balance mass BM moves.

Preferably a supporting element 530 includes two leaf springs which are attached together with an elastic hinge 535. Thus when the central structure 520 moves relative to the outer structure 510, the supporting elements 530 bend at pivot points 535, 536, 537, and the force exerted by the elastic hinges provides a small centralizing force on the central structure 520. This effect can be advantageous in that drift of a balance mass BM away from a central equilibrium position can be reduced. Of course the pivot points 535, 536 and 537 may be near frictionless hinges (e.g. hinges having pins).

One way to manufacture the supporting elements 530 of the sixth embodiments is by machining the whole of the balance mass supporting member 500 from one piece of material. For example, the supporting elements 530 can be made of a single piece of material in which the pivot portions 535, 536, 537 are manufactured to be thinner than the non-bending portions 532, 534. Such an element is illustrated in FIG. 14.

If the balance mass supporting member 500 is of the order of 300 mm in diameter, this allows the central portion 520 to have a range of motion of about 10 mm from its central position. In at least some proposed apparatus, this range is enough for the balance mass BM to perform its proper function. Alternatively, the balance mass may also be supported by at least three supporting members 530 connected between the base frame and the balance mass. In a further alternative, the balance mass may be supported by a supporting member 500 and one or more supporting members 110, 210, 250, 310 (third or fourth embodiment), 400 as described herein.

Although supporting member 500 is described as being attached to the balance mass at central structure 520 and to the base frame at attachment points 515, in some arrangements the member may be reversed such that i.e. it is attached to the balance mass at attachment points 515. Additionally, in other arrangements outer structure 510 may have another form that provides for coupling of supporting elements 530 to base frame BF (or to balance mass BM as described in the preceding sentence).

Figure 16:
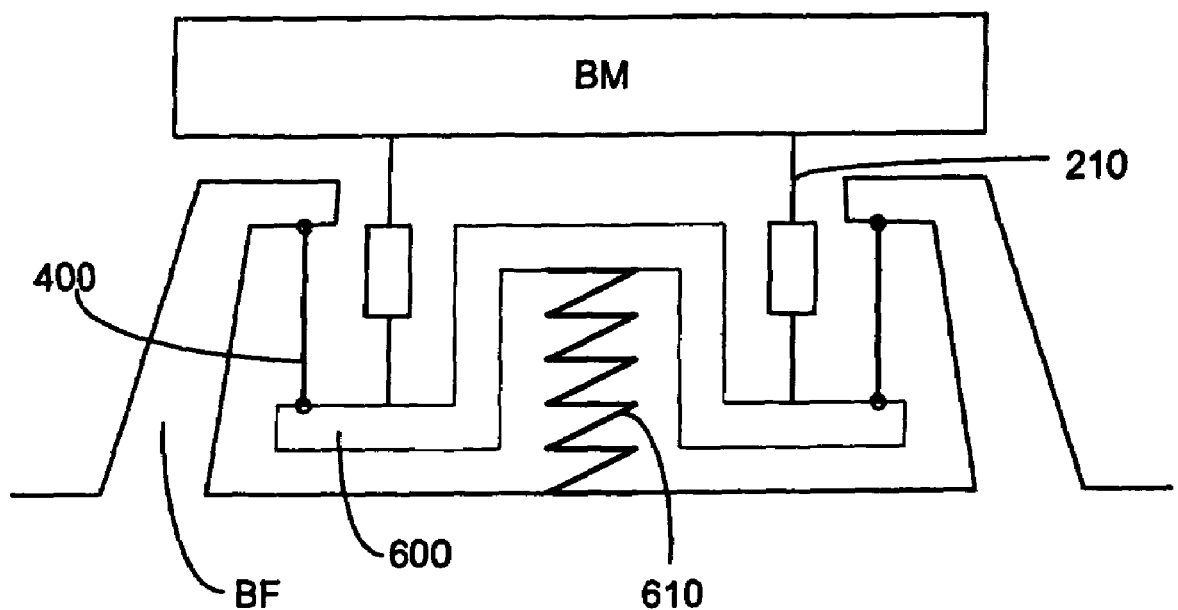
FIG. 16 illustrates a principle of operation of a seventh embodiment of the present invention.

The seventh embodiment will be described with reference to a two-dimensional system (i.e. one which allows movement with one degree of freedom) with reference to FIG. 16. The seventh embodiment is the same as the first embodiment save as described below.

The seventh embodiment is a hybrid embodiment in which the balance mass BM is supported by supporting elements 210 (described in relation to FIG. 6 above) on an intermediate frame 600. The intermediate frame 600 is attached to the base frame BF with supporting elements 400 as previously described with reference to FIG. 13. Optionally this intermediate frame 600 is also partially supported by a compression spring 610 connected between the intermediate frame 600 and the base frame BF.

The seventh embodiment illustrates that features of all of the embodiments described above may be used in combination with each other thereby to provide a support for the balance mass which is suitable for a vacuum environment. Therefore, all other such combinations of supporting elements and members as described herein are explicitly contemplated.

Thus the means for supporting the balance mass can easily be made in a vacuum-compliant way and the need for complicated and expensive shielding of air bearings is avoided. The supporting element may also guide the balance mass. The element may be flexible either by way of being hinged or by being made of a material which flexes under the operational loads.

By virtue of the supporting element having at least two pivot points, the supporting means presents little resistance to horizontal movement of the balance mass (preferably with zero or near-zero horizontal stiffness). Thus the balance mass moves in a similar way as when on air bearings, i.e. it can move in the horizontal (or whichever) plane substantially without tilting or deviating into another plane as is the case if the balance mass is supported on springs. It should be noted that in some embodiments there is some movement of the balance mass outside of the desired plane (x, y and $R_z$). Such movements outside the desired plane can be minimized by providing sufficient vertical stiffness to the balance mass.

Preferably each supporting element is positioned, in use, below the balance mass such that, on displacement of said balance mass from an equilibrium position in which said pivot points align vertically, a horizontal force in the direction of movement of the balance mass is generated by the action of gravity on said balance mass. In combination with an elastic means to provide a compensating force on said balance mass opposite in direction to said horizontal force generated by gravity, such an arrangement allows the horizontal stiffness of the balance mass to be made close to zero by arranging for the compensating force to be equal in magnitude to the horizontal force such that the balance mass can be operated in a near-perfect way. In some applications (for example, see European Patent Publication No. EP 02253970.4, which document is herein incorporated by reference in its entirety), stiffness in the horizontal direction is required. Such stiffness can be provided by using an over- or under-sized elastic means so that the compensating force is larger or lower in magnitude than the horizontal force generated by gravity.

In at least one embodiment, the supporting element comprises a middle section, at least two base frame connecting members pivotally attached at one end to said middle section and at the other end to said base frame, and at least two balance mass connecting members pivotally attached at one end to said middle section and at the other end to said balance mass. Such an embodiment may have the advantage that when the balance mass is supported on such a supporting element, during movement of the balance mass in the horizontal direction, the tilt or vertical movement of the balance mass relative to the base frame is minimized.

Whilst specific embodiments of the invention have been described above, it will be appreciated that the invention as claimed may be practiced otherwise than as described. It is explicitly noted that the description of these embodiments is not intended to limit the invention as claimed.

What is claimed is:

1. A lithographic apparatus comprising:
an illuminator;
a substrate table disposed in a path of a radiation beam from the illuminator;
a patterning device support disposed to hold a patterning device in the path of the radiation beam between the illuminator and the substrate table;
a projection system disposed in a path of the radiation beam between the patterning device support and the substrate table;
a base frame;
a balance mass supported by and moveable relative to the base frame and coupled to at least one of the substrate table and the patterning device support; and
at least one supporting member attached to the balance mass and to the base frame,
wherein the at least one supporting member has a stiff portion and at least two pivot points,
wherein the at least one supporting member includes an end portion at a first end of the stiff portion and another end portion at a second end of the stiff portion,
the stiff portion being more stiff than at least one of the end portions, and
wherein the at least two pivot points allow for movement of the balance mass in a first direction opposite to a direction of movement of the substrate table and allow for rotation in a second direction perpendicular to a plane of the balance mass.

2. The lithographic apparatus according to claim 1, wherein at least one of the pivot points is formed in a corresponding end portion by removing material from the supporting member.

3. The lithographic apparatus according to claim 1, further comprising a third pivot point between the at least two pivot points of the at least one supporting member, and wherein each of the pivot points allow relative rotation of the supporting member around an axis which is substantially orthogonal to the plane in which the balance mass moves.

4. A lithographic apparatus comprising:
an illuminator;
a substrate table disposed in a path of a radiation beam from the illuminator;
a patterning device support disposed to hold a patterning device in the path of the radiation beam between the illuminator and the substrate table;
a projection system disposed in a path of the radiation beam between the patterning device support and the substrate table;
a base frame comprising at least one rigid support, the at least one rigid support extending from the plane of the base frame;
a balance mass supported by and moveable relative to the base frame and coupled to at least one of the substrate table and the patterning device support; and at least one supporting member attached to the balance mass and to the at least one rigid support of the base frame, wherein the at least one supporting member has a stiff portion and at least two pivot points, and wherein a portion of the at least one supporting member that includes the stiff portion and the at least two pivot points is machined from one piece of material.

5. The lithographic apparatus according to claim 4, wherein the at least one rigid support member extends from the plane of the base frame and toward the plane of the balance mass.

6. A lithographic apparatus comprising:

an illuminator;

a substrate table disposed in a path of a radiation beam from the illuminator;

a patterning device support disposed to hold a patterning device in the path of the radiation beam between the illuminator and the substrate table;

a projection system disposed in a path of the radiation beam between the patterning device support and the substrate table;

a base frame;

a balance mass supported by and moveable relative to the base frame and coupled to at least one of the substrate table and the patterning device support; and at least one supporting member attached to the balance mass and to the base frame, wherein the at least one supporting member has a stiff portion and at least two pivot points, and wherein at least one of the pivot points includes a portion that is thinner than a portion of the at least one supporting member on either side of the pivot point, and wherein the thinner portions are connected at an acute angle relative to the base frame and balance mass.

7. The lithographic apparatus according to claim 6, wherein the at least one supporting member further comprises a stiff, middle section between the base frame and the balance mass, the thinner portions being pivotally connected to the stiff, middle section.

8. A lithographic apparatus comprising:

an illuminator;

a substrate table disposed in a path of a radiation beam from the illuminator;

a patterning device support disposed to hold a patterning device in the path of the radiation beam between the illuminator and the substrate table;

a projection system disposed in a path of the radiation beam between the patterning device support and the substrate table;

a base frame;

a balance mass supported by and moveable relative to the base frame and coupled to at least one of the substrate table and the patterning device support; and at least one supporting member attached to the balance mass and to the base frame, wherein the at least one supporting member has a stiff portion and at least two pivot points, and wherein the at least one supporting element is disposed such that on displacement of the balance mass from an equilibrium position in which the pivot points align vertically, a horizontal force in the direction of the displacement is generated by the action of gravity.

9. The lithographic apparatus according to claim 8, further comprising an intermediate frame, the intermediate frame being connected to the base frame and the balance mass by the at least one supporting member in a vertical direction.

10. The lithographic apparatus according to claim 9, further comprising a compression spring connecting the intermediate frame to the base frame.

11. A lithographic apparatus comprising:

an illuminator;

a substrate table disposed in a path of a radiation beam from the illuminator;

a patterning device support disposed to hold a patterning device in the path of the radiation beam between the illuminator and the substrate table;

a projection system disposed in a path of the radiation beam between the patterning device support and the substrate table;

a base frame;

a balance mass supported by and moveable relative to the base frame and coupled to at least one of the substrate table and the patterning device support; and at least one supporting member attached to the balance mass and to the base frame, the at least one supporting member positioned below the balance mass, wherein across an entire cross-section of the at least one supporting member, the at least one supporting member is disposed to be under tension in a direction parallel to a principal axis of the at least one supporting member, the cross-section being in a plane perpendicular to the principal axis.

* * * * *